United States Patent
Zamir et al.

(10) Patent No.: US 9,503,796 B2
(45) Date of Patent: Nov. 22, 2016

(54) SPEAKER

(71) Applicant: Bose Corporation, Framingham, MA (US)

(72) Inventors: Lee Zamir, Cambridge, MA (US); Michael Andrew Zalisk, Arlington, MA (US); Darius Darayes Mobed, Watertown, MA (US); Daniel D. Najemy, Wayland, MA (US)

(73) Assignee: Bose Corporation, Framingham, MA (US)

( * ) Notice: Subject to any disclaimer, the term of this patent is extended or adjusted under 35 U.S.C. 154(b) by 66 days.

(21) Appl. No.: 14/618,963

(22) Filed: Feb. 10, 2015

(65) Prior Publication Data

US 2016/0234583 A1    Aug. 11, 2016

(51) Int. Cl.
*H04R 1/02* (2006.01)
*H03F 3/181* (2006.01)

(52) U.S. Cl.
CPC ............... *H04R 1/02* (2013.01); *H03F 3/181* (2013.01); *H04R 2420/07* (2013.01)

(58) Field of Classification Search
CPC ............................. G09B 23/14; G09B 1/325
See application file for complete search history.

(56) References Cited

U.S. PATENT DOCUMENTS

| | | | | | |
|---|---|---|---|---|---|
| 4,122,911 A | * | 10/1978 | Croup | ................... | H04R 1/021 181/148 |
| 4,451,711 A | * | 5/1984 | Jackson | ................... | H04R 1/02 312/265.5 |
| 4,773,502 A | * | 9/1988 | Adair | ................... | H04R 1/02 181/144 |
| 5,627,350 A | * | 5/1997 | Kang | ................... | H04R 1/02 181/199 |
| 5,979,591 A | * | 11/1999 | Harrison | ................... | H04R 1/02 181/151 |
| 6,910,548 B2 | * | 6/2005 | Powell | ................... | H04R 1/02 181/199 |
| 7,967,104 B2 | * | 6/2011 | Carter | ................... | H04R 1/02 181/198 |
| 8,315,417 B2 | * | 11/2012 | Basore | ................... | H04R 1/02 181/148 |
| 2002/0159610 A1 | * | 10/2002 | Bank | ................... | H04R 1/025 381/152 |
| 2004/0175014 A1 | * | 9/2004 | Liu | ................... | H04R 1/028 381/386 |
| 2005/0280550 A1 | * | 12/2005 | Kurian | ................... | H05B 37/0245 340/815.45 |
| 2006/0165248 A1 | * | 7/2006 | Butcher | ................... | H04R 1/021 381/345 |
| 2010/0226617 A1 | * | 9/2010 | Piccionelli | ................... | A47G 33/08 345/2.1 |
| 2012/0300962 A1 | * | 11/2012 | Devoto | ................... | H04R 5/02 381/300 |
| 2015/0086963 A1 | * | 3/2015 | Zamir | ................... | G09B 1/325 434/379 |
| 2015/0086966 A1 | * | 3/2015 | Zamir | ................... | H03F 3/181 434/379 |
| 2015/0189425 A1 | * | 7/2015 | Pang | ................... | H04M 1/6041 381/77 |

OTHER PUBLICATIONS

International Search Report and Written Opinion dated Apr. 29, 2016 for PCT/US2016/017335.

(Continued)

*Primary Examiner* — Brenda Bernardi
(74) *Attorney, Agent, or Firm* — Bose Corporation

(57) ABSTRACT

In one aspect, a speaker kit includes a first portion of a speaker housing, and an electroacoustic driver that can be secured to the housing first portion. The kit has one or more additional portions of the speaker housing. One of the one or more additional housing portions has at least one electrical component secured thereto. The kit also has one or more mechanisms that can be used to hold the housing portions together such that the housing portions form an acoustic seal that encompasses an acoustic volume. The one or more mechanisms are removable from the housing portions such that the housing portions can be moved away from each other without damage to the housing portions or the one or more mechanisms.

35 Claims, 4 Drawing Sheets

(56) References Cited

OTHER PUBLICATIONS

"Loudspeaker kits", retrieved from the Internet: URL:https://web.archive.org/web/20141029033819/http://www.theloudspeakerkit.com/loudspeaker-components/ [retrieved on Apr. 1, 2016]; the whole document.

* cited by examiner

Rainbow Scroll:

SPEAKER

FIELD OF THE DISCLOSURE

The present disclosure relates to a speaker kit and components thereof.

BACKGROUND

With the increase in prevalence of mobile computing devices, children are being introduced to computing technology at a younger age. For example, it is common for a child to be proficient in operating a mobile phone or a tablet computer. It is desirable to encourage children's interest and familiarity with aspects of audio, video, and communications technologies.

SUMMARY

All examples and features mentioned below can be combined in any technically possible way.

In one aspect, a speaker kit includes a first portion of a speaker housing, and an electroacoustic driver that can be secured to the housing first portion. The kit has one or more additional portions of the speaker housing. One of the one or more additional housing portions has at least one electrical component secured thereto. The kit also has one or more mechanisms that can be used to hold the housing portions together such that the housing portions form an acoustic seal that encompasses an acoustic volume. The one or more mechanisms are removable from the housing portions such that the housing portions can be moved away from each other without damage to the housing portions or the one or more mechanisms.

Embodiments may include one of the following features, or any combination thereof. There are six housing portions which when held together form a parallelepiped. The at least one electrical component is selected from the group of electrical components including an amplifier, a digital signal processor, a microcontroller, a Bluetooth radio, and a light emitting diode. One or more of the housing portions including a gasket. The one or more mechanisms are each a clip which holds together two edges of a pair of housing portions. The at least one electrical component includes a Bluetooth receiver which can receive Bluetooth A2DP signals containing audio data and Bluetooth LE signals containing command and control data. The at least one electrical component includes a port which can power a light source that can be used as both (i) a variable intensity lighting source, or (ii) a strobe light whose strobe rate is controllable to slow down a perceived motion of a diaphragm of the electroacoustic driver.

In another aspect, a speaker kit includes a first portion of a speaker housing, an electroacoustic driver that can be secured to the housing first portion, and one or more additional portions of the speaker housing. A wireless receiver can receive a first wireless signal containing audio data and a second, separate wireless signal containing control data. A port can power a light source that can be used as both (i) a variable intensity lighting source, or (ii) a strobe light whose strobe rate is controllable to slow down a perceived motion of a diaphragm of the electroacoustic driver. One or more mechanisms can be used to hold the housing portions together such that the housing portions form an acoustic seal that encompasses an acoustic volume.

Embodiments may include one of the above and/or below features, or any combination thereof. One of the one or more additional housing portions has at least one electrical component secured thereto. The one or more mechanisms are each a clip which holds together two edges of a pair of housing portions.

In yet another aspect, a user-assembled audio device includes an electroacoustic driver, an audio amplifier, an audio input operably connected to the audio amplifier, and a plurality of rigid housing portions configured to be assembled by a user to form a speaker housing. A first of the rigid housing portions is configured to receive the electroacoustic driver and a second of the rigid housing portions also houses the audio amplifier. One or more fasteners are configured to removably fasten the plurality of rigid housing portions together to form an acoustic seal between adjacent housing portions. A connector is configured to electrically connect the output of the amplifier to the electroacoustic driver.

Embodiments may include one of the above and/or below features, or any combination thereof. The electroacoustic driver is pre-installed in the first rigid housing portion configured to receive the electroacoustic driver. The audio amplifier is contained within the second rigid housing portion. The connector comprises a pig-tail connector attached to the electroacoustic driver and configured to plug into a jack that electrically connects to the audio amplifier. The plurality of rigid housing portions include a gasket that helps form an acoustic seal between adjacent housing portions when assembled by a user. The fasteners comprise removable clips that hold together adjacent housing portions. The fasteners comprise screws that hold together adjacent housing portions. The audio device further includes a second electroacoustic driver. One of the plurality of rigid housing portions is configured to receive the second electroacoustic driver. The first housing portion is also configured to receive the second electroacoustic driver. The user-assembled speaker including the one electroacoustic driver forms a mono-channel audio device. The audio device further includes a second user-assembled speaker housing containing a single electroacoustic driver. The second user-assembled speaker housing contains a single electroacoustic driver that is configured to be electrically connected to the audio amplifier housed in the second rigid portion of the first user-assembled speaker. The audio amplifier includes a two-channel amplifier and sends a first channel to the first user-assembled speaker and a second channel to the second user-assembled speaker. The audio amplifier is configured to output a mono-channel audio signal when only the first user-assembled speaker is connected and a two-channel audio signal when both the first and second user-assembled speakers are connected. The audio input comprises a physical connector for connecting an audio source. The physical connector comprises a 3.5 mm audio input jack. The audio input comprises a wireless receiver configured to receive wireless audio content. The wireless receiver comprises a Bluetooth receiver. The audio device further includes a signal processor for processing the audio received from the audio input prior to outputting the audio to the electroacoustic driver. The audio device further includes a wireless receiver for receiving wireless control commands. The audio device is enabled to allow control of the audio device via a separate computing device via the Bluetooth receiver. One of the control functions enabled is an alarm clock function that causes the audio device to play user-selected audio at a user-selected time.

DETAILED DESCRIPTION

The user-assembled speaker kits described below encourages understanding of a variety of technologies, such as acoustics, communications, electro-mechanical technologies.

Figure 1:
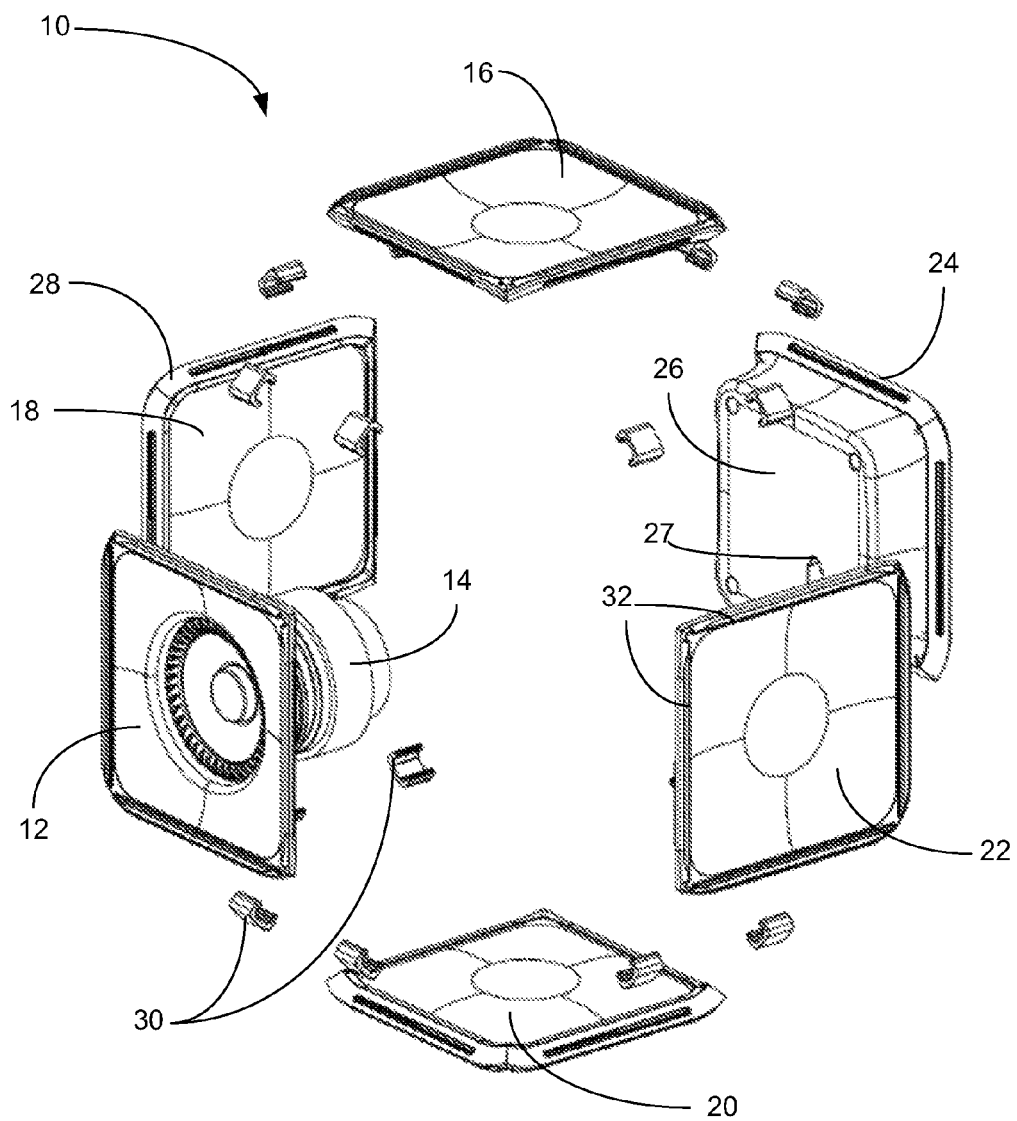
FIG. 1 is a perspective view of a speaker kit.
Figure 5:
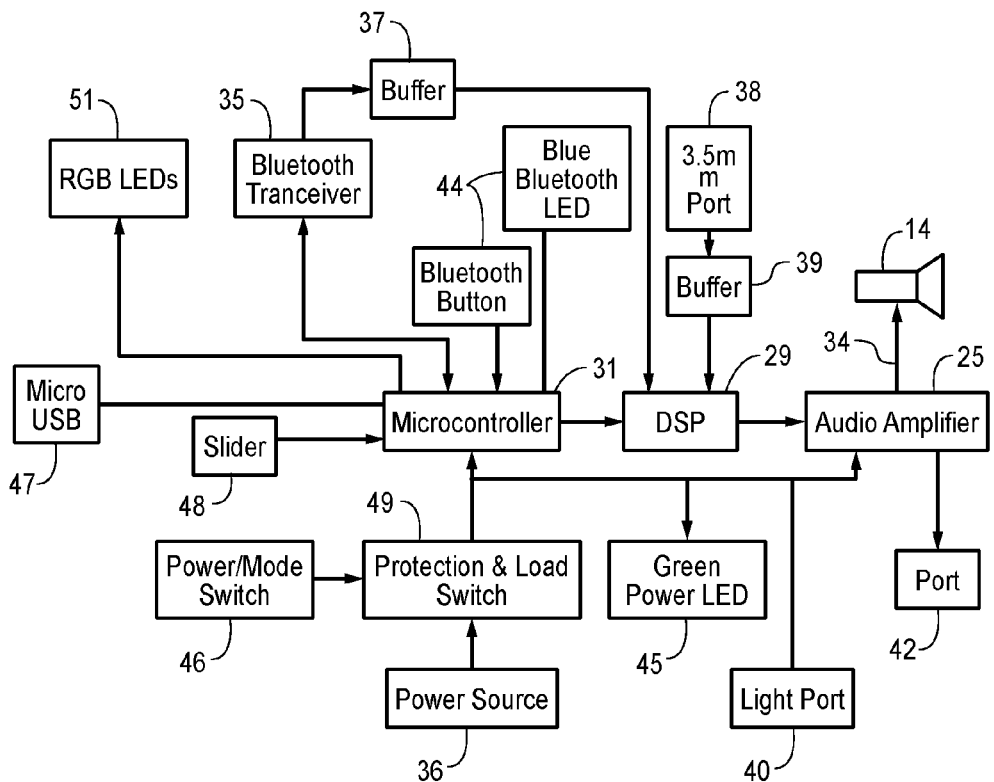
FIG. 5 is a schematic representation of the operational arrangement of the speaker.

With reference to FIGS. 1 and 5, a speaker kit 10 which can be assembled by a user into a speaker (i.e. an audio device) includes a first rigid portion 12 of a speaker housing. The first housing portion 12 is configured to have an electro-acoustic driver 14 secured (pre-installed) to it. Four additional rigid housing portions 16, 18, 20 and 22 are also provided with the kit. A sixth rigid housing portion 24 has electrical components 26 secured to the housing portion that include a two channel audio amplifier 25, a digital signal processor (DSP) 29, a microcontroller 31, an audio input in the form of a wireless receiver such as a Bluetooth transceiver 35 which can receive wireless Bluetooth A2DP signals containing audio data (i.e. content) and wireless control commands such Bluetooth LE signals containing command and control data, and one or more light emitting diodes (described in further detail below). The Bluetooth transceiver (or radio) communicates with the microcontroller 31 and with the DSP 29 via a buffer 37. The amplifier 25 is electrically connected via a jack 27 by a pair of wires (not shown) to the driver 14.

Referring to FIG. 1, each of the housing portions are preferably made of translucent plastic and preferably include a translucent gasket 28 (preferably made of rubber) that is located about a periphery of the housing portion. The housing portions are configured to be assembled by a user to form a speaker housing. Instead of using a single driver 14, a pair of smaller drivers can be secured to the housing portion 12. Alternatively, the pair of drivers can be respectively secured to opposing housing portions 18 and 22 so that mechanical vibrations from the speakers substantially cancel out.

A group of sixteen fastening mechanisms in the form of clips 30 are used to hold the housing portions together such that the housing portions form an acoustic seal (a substantially airtight seal that preferably has less than about 1% leakage to/from an external environment) that encompasses an acoustic volume. Each clip 30 is slid onto or snapped onto a pair of adjacent edges of a respective pair of housing portions. The edges of the housing portion each have a lip 32 onto which the clip can grab and remain secured. The clips 30 are preferably made of plastic or metal. Although two clips 30 are shown for holding each pair of edges together, a single longer clip or more than two clips can be used. In another example screws, bolts, nails or other fasteners are used instead of or in addition to clips to hold the housing portions together.

Figure 6:
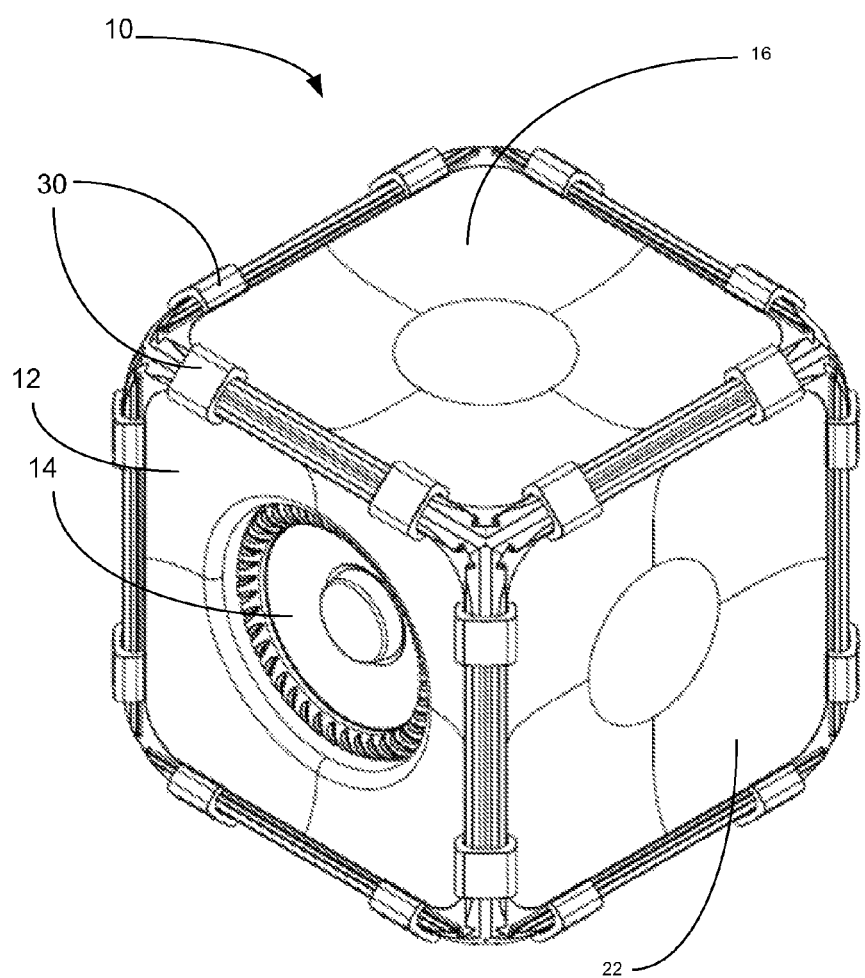
FIG. 6 is a perspective view of the speaker kit of FIG. 1 in an assembled state.

As shown in FIG. 6, when the six housing portions are assembled together they form a parallelepiped (in this example a cube). Other arrangements of housing portions may be used. For example, a spherical speaker kit may have two, three or four housing portions which are secured together to encompass an acoustic volume. If a spherical kit with two hemispherically shaped housing portions are used, a single clip may be flexed to a more open configuration and then allowed to retract so that it can be snapped onto the lips of the two housing portions. After the speaker has been assembled, the clips 30 can be removed from the housing portions such that the housing portions can be moved away from each other without damage to the housing portions or the clips. A pyramid shape with five housing portions is another example of a speaker shape.

Figure 2:
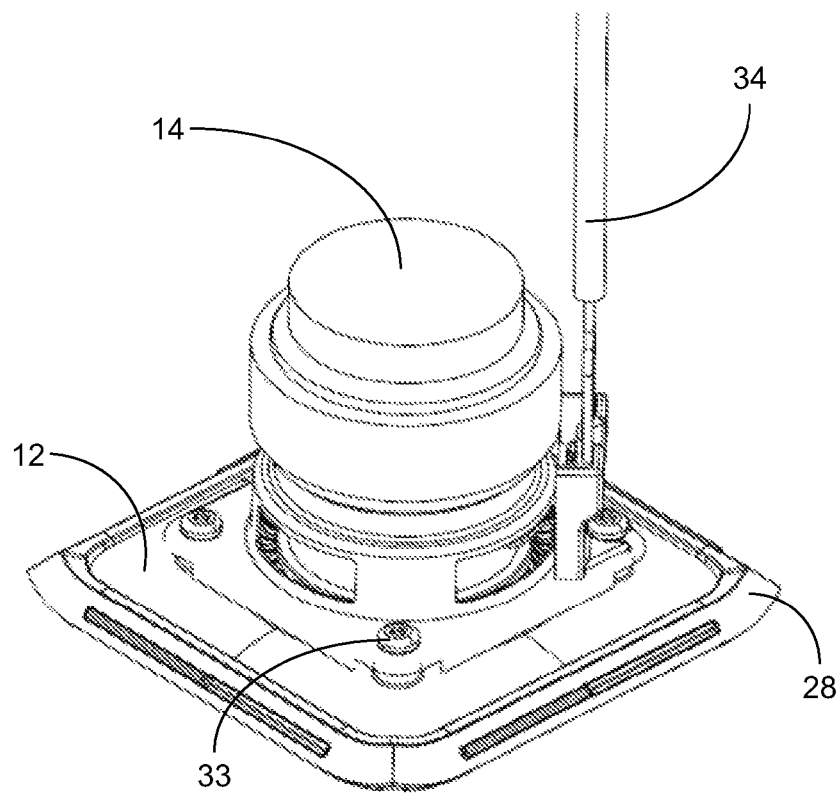
FIG. 2 a perspective view of a housing portion of the speaker kit of FIG. 1 with an electroacoustic transducer secured thereto.

Turning to FIG. 2, the housing portion 12 is shown with the electro-acoustic driver 14 secured to it by four screws 33 (one screw is behind the transducer and is not visible). A gasket 28 is also visible in this view. An electrical connector in the form of a pair of wires 34 (mentioned above) connects at a first end via a pigtail connector to the driver 14 and at a second end to the jack 27 (FIG. 1) which is electrically connected to the amplifier 25. In another example, the driver 14 may not be secured to the housing portion 12 in the kit, but gets secured to the housing portion 12 by the person assembling the kit into a speaker.

Figure 3:
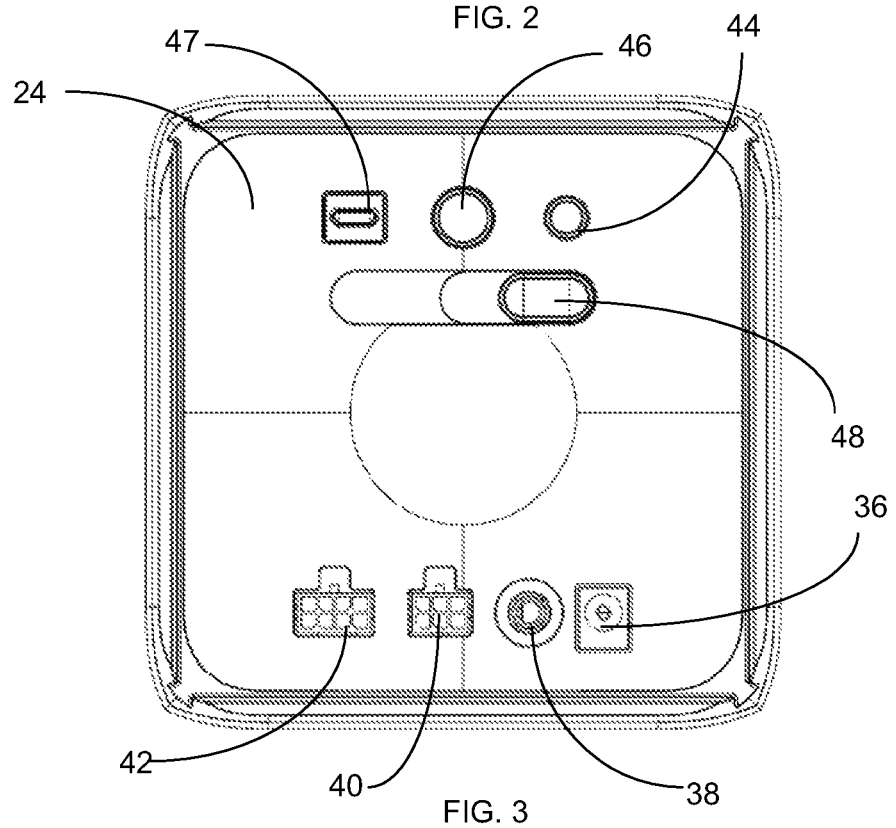
FIG. 3 a plan view of a housing portion of the speaker kit of FIG. 1.

With reference to FIGS. 3 and 5, a back side of the housing portion 24 which is not visible in FIG. 1 is shown. The housing portion 24 includes a power port (source) 36 which receives 12 volt DC electrical power from an external AC/DC power supply which is plugged into AC mains power. In addition to or as an alternate to using AC mains power, a disposable or rechargeable battery can be used to provide electrical power to the speaker. A 3.5 mm port 38 is provided for use as an auxiliary audio input physical connector from an external audio source. An audio signal from the port 38 passes through a buffer 39 and then is passed onto the DSP 29. A light port 40 is used to provide electrical power to a light source that can be used as both (i) a variable intensity lighting source, or (ii) a strobe light whose strobe rate is controllable to slow down a perceived motion of a diaphragm of the electroacoustic driver. A port 42 can provide amplified audio signals from the amplifier 25 on the housing portion 24 over an electrical connection for operating a separate user assembled speaker housing containing a single electroacoustic driver (not shown) which can be operated with the instant speaker kit 10 as a stereo pair. Alternatively, the separate speaker can be a bass box.

A Bluetooth button/indicator 44 is provided for pairing the speaker via a Bluetooth wireless connection with an external audio source device (not shown). The button 44 is pressed and released to put the speaker into discoverable mode for a set period of time. In this state a blue LED indicator inside the button is flashing on and off. At the audio source device (e.g. a computing device such as an iPhone) a user looks for the speaker in the list of available Bluetooth devices and then selects the speaker in order to create a Bluetooth A2DP connection between the audio source device and the speaker. The blue LED is now steadily lit. The user then starts up an application on the audio source device that is used to control the speaker and places the audio source device next to the speaker to cause a Bluetooth LE connection to automatically be created via the A2DP pairing. The Bluetooth LE connection allows control of the speaker by the audio source device. The application on the audio source device can include a control a function in the form of an alarm clock that causes the audio source device to play user-selected audio at a user-selected time over the speaker.

A power/mode button 46 is used for selecting on or standby states of the speaker, and for causing the speaker to cycle through various modes (discussed below). To turn the speaker on when it is currently in a standby state, the button 46 is pressed and released. The speaker will turn on to the last selected mode when the speaker was last turned to a standby state and a green power LED 45 adjacent to the power port 36 is lit. To turn the speaker to standby when it is currently powered on, the button 46 is pressed and held for at least two seconds. In standby the green LED 45 is not lit. The power source 36 and power/mode switch 46 are both electrically connected to the microcontroller 31 through a protection and load switch 49 A micro USB port 47 is used for microcontroller programming (e.g. Arduino programming) and firmware updating.

Figure 4:
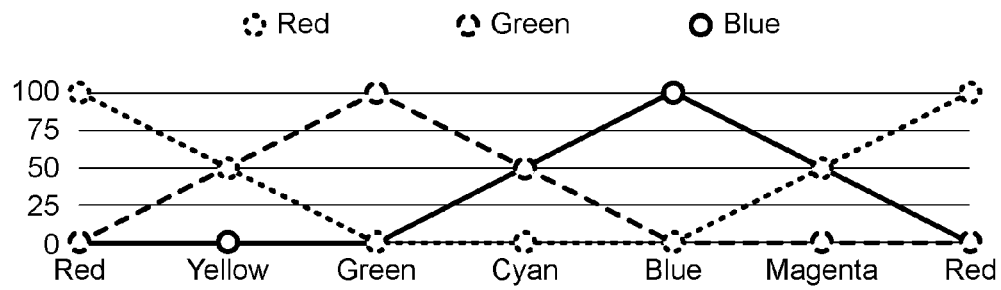
FIG. 4 is a graph that shows the intensity levels of RGB LEDs and the color that results therefrom.

When the speaker is on it can be in one of number of modes which are cycled through by briefly pressing the button 46. In a color select mode a user moves a slider 48 (FIG. 3) to select a color from the rainbow which is created by red, green and blue LEDs 51 inside the speaker. This color will be transmitted through the translucent speaker housing. In FIG. 4 the Y axis shows the percent that each of these LEDS 51 are powered on relative to a full on state. The X axis shows the resulting color that is obtained based on the intensity level of each of the red, green and blue LEDs 51.

In a color cycle mode the user moves the slider 48 to select a rate (e.g. 500 ms to 5 seconds) at which the speaker will automatically cycle smoothly through a complete rainbow spectrum. In a color random mode the user moves the slider to select a rate (e.g. 100 ms to 2 seconds) at which the speaker will automatically abruptly change a cycling through the rainbow. In a color candle mode the user moves the slider 48 to select a color with the intensity of the LEDs 51 being varied to simulate the flickering of a candle. In a color beat mode an audio signal received by the port 38 is used to drive a color intensity response in the red, blue and green LEDs 51. For example, the intensity of the red LED is controlled as a function of the acoustic level in the 20 Hz-200 Hz band, the intensity of the green LED is controlled as a function of the acoustic level in the 200 Hz-1000 Hz band, and the intensity of the blue LED is controlled as a function of the acoustic level in the 1 kHz-10 kHz band. If no audio signal is present the three LEDs 51 are set to create a dim white light.

In a tone generator mode the microcontroller 31 creates a sine wave on a channel driving the driver 14 and a square wave that is transmitted out of the port 42 to a separate speaker. The slider position sets the frequency from, for example, 5 Hz-500 Hz and the LEDs 51 are set to achieve a dim yellow light. In a filter sweep mode an audio signal received on the port 38 is narrow band filtered with the center of the band being set by the position of the slider 48. For example the band can be 100 Hz wide and the center of the band can be set from 50 Hz to 10 kHz.

A number of implementations have been described. Nevertheless, it will be understood that additional modifications may be made without departing from the scope of the inventive concepts described herein, and, accordingly, other embodiments are within the scope of the following claims.

What is claimed is:

1. A speaker kit, comprising:
   a first portion of a speaker housing;
   an electroacoustic driver that can be secured to the housing first portion;
   one or more additional portions of the speaker housing, one of the one or more additional housing portions having at least one electrical component secured thereto;
   one or more mechanisms that can be used to hold the housing portions together such that the housing portions form an acoustic seal that encompasses an acoustic volume, the one or more mechanisms being removable from the housing portions such that the housing portions can be moved away from each other without damage to the housing portions or the one or more mechanisms;
   wherein the at least one electrical component is selected from the group of electrical components including an amplifier, a digital signal processor, a microcontroller, a Bluetooth radio, and a light emitting diode.

2. The speaker kit of claim 1, wherein there are six housing portions which when held together form a parallelepiped.

3. The speaker kit of claim 1, wherein one or more of the housing portions includes a gasket.

4. The speaker kit of claim 1, wherein the one or more mechanisms are each a clip which holds together two edges of a pair of housing portions.

5. The speaker kit of claim 1, wherein the at least one electrical component includes a Bluetooth receiver which can receive Bluetooth A2DP signals containing audio data and Bluetooth LE signals containing command and control data.

6. The speaker kit of claim 1, wherein the at least one electrical component includes a port which can power a light source that can be used as both (i) a variable intensity lighting source, or (ii) a strobe light whose strobe rate is controllable to slow down a perceived motion of a diaphragm of the electroacoustic driver.

7. A speaker kit, comprising:
   a first portion of a speaker housing;
   an electroacoustic driver that can be secured to the housing first portion;
   one or more additional portions of the speaker housing;
   a wireless receiver which can receive a first wireless signal containing audio data and a second, separate wireless signal containing control data;
   a port which can power a light source that can be used as both (i) a variable intensity lighting source, or (ii) a strobe light whose strobe rate is controllable to slow down a perceived motion of a diaphragm of the electroacoustic driver; and
   one or more mechanisms that can be used to hold the housing portions together such that the housing portions form an acoustic seal that encompasses an acoustic volume, and such that the housing portions can be moved away from each other without damage to the housing portions or the one or more mechanisms.

8. The speaker kit of claim 7, wherein one of the one or more additional housing portions has at least one electrical component secured thereto.

9. The speaker kit of claim 8, wherein the at least one electrical component is selected from the group of electrical components including an amplifier, a digital signal processor, a microcontroller, a Bluetooth radio, and a light emitting diode.

10. The speaker kit of claim 7, wherein there are six housing portions which when held together form a parallelepiped.

11. The speaker kit of claim 7, wherein one or more of the housing portions includes a gasket.

12. The speaker kit of claim 7, wherein the one or more mechanisms are each a clip which holds together two edges of a pair of housing portions.

13. A user-assembled audio device comprising:
an electroacoustic driver;
an audio amplifier;
an audio input operably connected to the audio amplifier;
a plurality of rigid housing portions configured to be assembled by a user to form a speaker housing, wherein a first of the rigid housing portions is configured to receive the electroacoustic driver and wherein a second of the rigid housing portions houses the audio amplifier;
one or more fasteners that are configured to removably fasten the plurality of rigid housing portions together to form an acoustic seal between adjacent housing portions; and
a connector configured to electrically connect the output of the amplifier to the electroacoustic driver.

14. The audio device of claim 13, wherein the electroacoustic driver is pre-installed in the first rigid housing portion configured to receive the electroacoustic driver.

15. The audio device of claim 13, wherein the audio amplifier is contained within the second rigid housing portion.

16. The audio device of claim 13, wherein the connector comprises a pig-tail connector attached to the electroacoustic driver and configured to plug into a jack that electrically connects to the audio amplifier.

17. The audio device of claim 13, wherein the plurality of rigid housing portions include a gasket that helps form an acoustic seal between adjacent housing portions when assembled by a user.

18. The audio device of claim 13, wherein the fasteners comprise removable clips that hold together adjacent housing portions.

19. The audio device of claim 13, wherein the fasteners comprise screws that hold together adjacent housing portions.

20. The audio device of claim 13, further comprising
a second electroacoustic driver, and wherein one of the plurality of rigid housing portions is configured to receive the second electroacoustic driver.

21. The audio device of claim 20, wherein the first housing portion is also configured to receive the second electroacoustic driver.

22. The audio device of claim 13, wherein the user-assembled speaker including the one electroacoustic driver forms a mono-channel audio device.

23. The audio device of claim 22, further comprising:
a second user-assembled speaker housing containing a single electroacoustic driver.

24. The audio device of claim 23, wherein the second user-assembled speaker housing containing a single electroacoustic driver is configured to be electrically connected to the audio amplifier housed in the second rigid housing portion of the first user-assembled speaker.

25. The audio device of claim 24, wherein the audio amplifier comprises a two-channel amplifier and sends a first channel to the the first user-assembled speaker housing and a second channel to the second user-assembled speaker housing.

26. The audio device of claim 25, wherein the audio amplifier is configured to output a mono-channel audio signal when only the first user-assembled speaker housing is connected and a two-channel audio signal when both the first and second user-assembled speaker housings are connected.

27. The audio device of claim 13, wherein the audio input comprises a physical connector for connecting an audio source.

28. The audio device of claim 27, wherein the physical connector comprises a 3.5 mm audio input jack.

29. The audio device of claim 13, wherein the audio input comprises a wireless receiver configured to receive wireless audio content.

30. The audio device of claim 29 wherein the wireless receiver comprises a Bluetooth receiver.

31. The audio device of claim 13 further comprising a digital signal processor for processing the audio received from the audio input prior to outputting the audio to the electroacoustic driver.

32. The audio device of claim 13, further comprising a wireless receiver for receiving wireless control commands.

33. The audio device of claim 32, wherein the wireless receiver comprises a Bluetooth receiver.

34. The audio device of claim 33, wherein the audio device is enabled to allow control of the audio device via a separate computing device via the Bluetooth receiver.

35. The audio device of claim 34, wherein one of the control functions enabled is an alarm clock function that causes the audio device to play user-selected audio at a user-selected time.

* * * * *